United States Patent [19]

Ecklund

[11] Patent Number: 4,583,244
[45] Date of Patent: Apr. 15, 1986

[54] AUTOMATIC FREQUENCY CONTROL FOR LOCAL OSCILLATOR USED WITH AN AM STEREO DECODER

[75] Inventor: Lawrence M. Ecklund, Wheaton, Ill.
[73] Assignee: Motorola, Inc., Schaumburg, Ill.
[21] Appl. No.: 622,930
[22] Filed: Jun. 21, 1984
[51] Int. Cl.[4] .............................................. H04H 5/00
[52] U.S. Cl. ........................................ 381/15; 331/17; 455/262
[58] Field of Search .......................... 381/2, 4, 13, 15; 331/17, 25; 455/261, 262, 263, 264

[56] References Cited
U.S. PATENT DOCUMENTS 4,377,728  3/1983  Hilbert ................................... 381/15
4,525,686  6/1985  Yokoya ................................... 381/15

Primary Examiner—Forester W. Isen
Attorney, Agent, or Firm—Margaret Marsh Parker; Vincent J. Rauner

[57] ABSTRACT

The AFC gain of the local oscillator of an AM stereophonic decoder is linearized by the use of difference channel (L−R) information for controlling the capacitance of two varactor-type devices coupled across and in series with the oscillator inductance coil. The improvement helps to prevent "falsing" of the pilot tone indicator and the mono/stereo mode circuitry, particularly at the ends of the tuning range of a manually tuned receiver.

8 Claims, 1 Drawing Figure

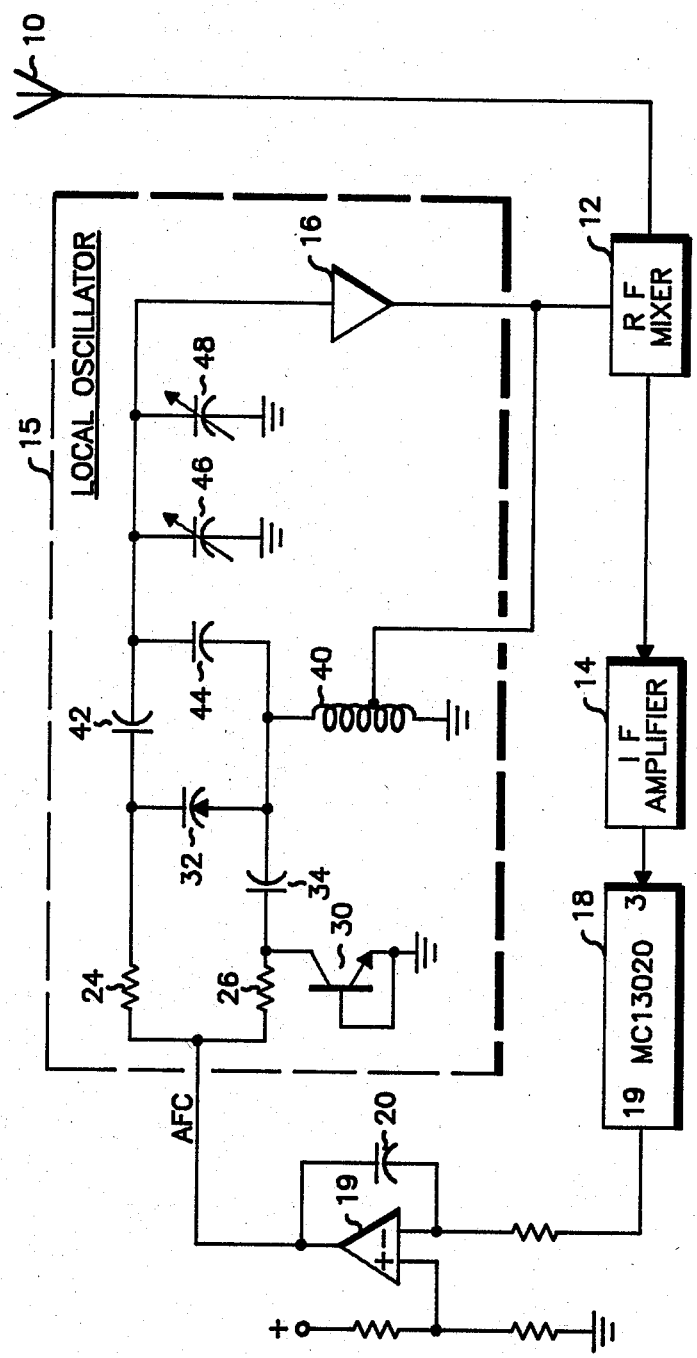

AUTOMATIC FREQUENCY CONTROL FOR LOCAL OSCILLATOR USED WITH AN AM STEREO DECODER

BACKGROUND OF THE INVENTION

This invention relates to the field of automatic frequency control and, more particularly, to the provision of a simple and inexpensive means of automatic frequency control for the local oscillator used with an AM stereophonic decoder.

In a manually tuned receiver used for decoding AM stereo signals, the oscillator in the decoder is typically of a type which is more easily "pulled" into a locked condition than a crystal oscillator would be. This means that the decoder oscillator is not as sharply tuned as is desirable and that the gain of the local oscillator loop must be kept as constant as possible over the tuning range of the receiver. This requirement is due to the fact that, as the gain decreases, the corner frequency of the pilot tone detector also decreases, causing an increase in the output of the pilot tone bandpass filter if there is any input, pilot tone or otherwise. If severe enough, this increase in gain can cause "falsing" or activation of the stereo mode indicator and the stereo mode switching circuit, particularly at the ends of the tuning range. More important, perhaps, is the effect of gain change in the local oscillator AFC loop on the pull-in range. If the range were reduced far below the desired range of ±7 kHz, for example, it would be necessary to tune the receiver very accurately in order to achieve lock-in. On the other hand, if the range were much greater than ±7 kHz, it could be difficult to separate stations, or the receiver might lock in on one station and stay locked until the next one had been passed by. Both of these effects are highly undesirable, even in an inexpensive stereo receiver, yet any solution must obviously be inexpensive.

SUMMARY OF THE INVENTION

It is, therefore, an object of the present invention to reduce the amount of change in gain in an AFC loop over the range of frequency of the local oscillator.

It is a particular object to provide this reduction with a minimum of complexity and cost.

These objects and others which will become apparent are attained in an AFC loop which includes one voltage controlled capacitive device, such as a varactor, coupled in series with the oscillator coil and a second voltage controlled capacitive device, coupled in parallel with the coil. The second voltage controlled device may be simply a diode or diode-connected transistor rather than the more expensive varactor device. The control voltage is supplied by the stereo decoder device and is related to the difference channel signal.

BRIEF DESCRIPTION OF THE DRAWING

The single drawing figure is a block/schematic diagram of a portion of an AM stereophonic receiver including the present invention.

DETAILED DESCRIPTION OF A PREFERRED EMBODIMENT

The drawing figure shows a substantial portion of an AM stereophonic receiver, including an antenna 10 coupled to feed received signals to an RF/mixer stage 12 which, in turn, feeds intermediate frequency signals to an IF stage 14. Also coupled to the RF/mixer stage 12 is, as is customary, a local oscillator 15. More specifically, the RF/Mixer stage 12 is coupled to a non-inverting buffer stage 16 of the local oscillator. More will be said about the local oscillator hereinafter. The output signals from the IF stage 14 are coupled to the demodulating circuits of an AM stereo decoder circuit 18 which is, preferably, an integrated circuit such as the Motorola MC13020. One output of that chip (Pin 19, labelled "Phase Detector Output" on the manufacturer's data sheets) provides the loop driver input signal for the VCO of the decoder. This signal is essentially the filtered difference signal, L−R.

The signal from Pin 19 of the IC 18 is coupled to the (−) input pin of an op amp 19. The (+) input of the op amp 19 is referenced to 4 VDC in this embodiment and a feedback capacitor 20 is coupled from the op amp output to the (−) input. The output of Pin 19 of the IC 18 will therefore be held at the reference voltage as long as there is voltage tuning range remaining on the control device of the local oscillator (see discussion of voltage controlled device 32 hereinbelow.)

The circuit components within a dashed line 21 also form a part of the local oscillator, and all together they serve the function of maintaining essentially constant gain over the range of operation of the local oscillator. The AFC signal is coupled to the first ends of two resistors 24,26. The second end of the resistor 26 is coupled to a first voltage controlled capacitive device 30 which may be a varactor, diode or a diode-connected transistor. With base and emitter grounded, a transistor is essentially a varactor with a range of approximately 10–16 pf. The second end of the resistor 24 is coupled to a second voltage controlled capacitive device 32 which, in most circumstances, should be a varactor such as an MVAM109. The other end of the second device 32 is coupled, through a capacitor 34, to the junction of the resistor 26 and the first device 30. The second end of the second device 32 is also coupled to the high end of an oscillator coil 40 the lower end of which is grounded.

The second end of the resistor 24 is coupled, through a capacitor 42, to a capacitor 44, a ganged tuning capacitor 46, a trimmer capacitor 48, and to the buffer stage 16. The capacitor 44 is coupled to the high end of the oscillator coil 40 and the ganged tuning capacitor 46 and the trimmer capacitor 48 are coupled to ground. The buffer stage 16 is coupled to a tap of the coil 40 and to the RF/Mixer 12.

The oscillator functions, in general, much as do oscillators in the prior art, with the main tuning control coming from the (manually controlled) variation in capacitance of the ganged tuner 46, modified by the trimmer capacitor 48, across the inductance of the coil 40. However, since the gain ratio over the range of the tuner may be as much as 17:1, causing the problems mentioned hereinabove, it is highly desirable to modify the circuit to maintain a more constant AFC sensitivity or AFC gain throughout the band.

At the low frequency end of the tuning range, the capacity of the ganged capacitor 46 is large, therefore the effect of a change in the capacitance of the device 32 will have a major effect, while the effect of a change in the device 30 will be relatively small. At the high end, the reverse is true; that is, the effect of changing capacitance in device 30 will have a relatively large effect, while the device 32 will have relatively little effect on the gain of the circuit. The combination of effects, therefore, will have a strong gain-linearizing effect across the tuning band.

In an exemplary embodiment, it will be assumed that the manually operated, ganged capacitor 46 has a range from 360 pf at the low end of the band to 38 pf at the high end. The capacitor 42 is taken to be 39 pf. An MVAM109 varactor varies from 56 pf to 400 pf with a control voltage range of 0–6 V. as is available here. The combined value range of varactor 32 and capacitors 42 and 44 is therefore from 275.5 pf to 263 pf. If the oscillator coil 40 is assumed to be 185 Nh, the AFC range at the low end of the broadcast band is from 936,656 Hz to 949,181 Hz, or ±6.263 kHz. At the high end, the AFC range is from 2,024,885 Hz to 2,030,710 Hz or ±2.912 kHz, showing that the AFC gain change across the band has been reduced to approximately 2:1.

When the transistor 30, resistor 26 and capacitor 34 are also added to the circuit, a further reduction is achieved. As mentioned hereinabove, the diode-connected transistor is approximately a 10–16 pf varactor. If the capacitor 34 has a small value; e.g., less than 5 pf, the AFC gain at the both the low and high ends of the tuning range will be essentially ±7 kHz; that is, nearly a 1:1 ratio overall.

Thus there has been shown and described an effective yet relatively inexpensive means for linearizing the AFC gain in the local oscillator of an AM stereo decoder. It will be apparent that other variations and modifications of the invention are possible, and it is intended to cover all such as fall within the spirit and scope of the appended claims.

What is claimed is:

1. An automatic frequency control (AFC) circuit in a local oscillator in an AM stereo receiver including first input means for selectively receiving AM stereophonic signals and converting said signals to intermediate frequency signals, and a decoder for providing sum and difference channel signals from the intermediate frequency signals, said local oscillator comprising:
   second input means for receiving an AFC signal;
   output means;
   an oscillator coil coupled across said input and output means;
   manually controllable capacitance means coupled across said oscillator coil;
   a voltage controlled capacitive device coupled in series with said oscillator coil;
   a source of control voltage coupled to said voltage controlled device, said control voltage being related to the level of the difference channel signal of said decoder; and
   means for coupling the output of said local oscillator to said first input means.

2. An AFC circuit in accordance with claim 1 and further including a second voltage controlled capacitive device coupled in parallel with said oscillator coil, and coupled to said source of control voltage.

3. An AFC circuit in accordance with claim 1 and wherein said manually controlled capacitance means is a ganged capacitor.

4. An AFC circuit in accordance with claim 1 and wherein said voltage controlled capacitive device is a varactor device.

5. An AFC circuit in accordance with claim 2 and wherein said second voltage controlled capacitive device is a varactor device.

6. An AFC circuit in accordance with claim 2 and wherein said second voltage controlled capacitive device is a diode-connected transistor device.

7. An AFC circuit in accordance with claim 2 and wherein said second voltage controlled capacitive device is a diode.

8. An AFC circuit in accordance with claim 1 and wherein said coupling means couples the output of the local oscillator for multiplication by the selectively received signals.

* * * * *